(12) United States Patent
Zuliani et al.

(10) Patent No.: US 9,991,316 B2
(45) Date of Patent: Jun. 5, 2018

(54) PHASE-CHANGE MEMORY CELL, AND METHOD FOR MANUFACTURING THE PHASE-CHANGE MEMORY CELL

(71) Applicant: STMICROELECTRONICS S.R.L., Agrate Brianza (IT)

(72) Inventors: Paola Zuliani, Milan (IT); Gianluigi Confalonieri, Dalmine (IT); Annalisa Gilardini, Gorgonzola (IT); Carlo Luigi Prelini, Seveso (IT)

(73) Assignee: STMICROELECTRONICS S.R.L., Agrage Brianza (IT)

( * ) Notice: Subject to any disclaimer, the term of this patent is extended or adjusted under 35 U.S.C. 154(b) by 0 days. days.

(21) Appl. No.: 15/374,304

(22) Filed: Dec. 9, 2016

(65) Prior Publication Data

US 2017/0373120 A1    Dec. 28, 2017

(30) Foreign Application Priority Data

Jun. 24, 2016  (EP) .................................... 16425063

(51) Int. Cl.
*H01L 29/70*  (2006.01)
*H01L 45/00*  (2006.01)
*H01L 27/24*  (2006.01)

(52) U.S. Cl.
CPC ...... *H01L 27/2463* (2013.01); *H01L 27/2436* (2013.01); *H01L 45/06* (2013.01);
(Continued)

(58) Field of Classification Search
CPC ... H01L 45/06; H01L 27/2436; H01L 45/126; H01L 45/144; H01L 45/1683; H01L 23/5329; H01L 21/31144
See application file for complete search history.

(56) References Cited

U.S. PATENT DOCUMENTS

| 7,422,926 B2 | 9/2008 | Pellizzer et al. |
| 2006/0091476 A1* | 5/2006 | Pinnow ............... H01L 21/0332 257/379 |

(Continued)

OTHER PUBLICATIONS

P. Zuliani, et al., "Overcoming Temperature Limitations in Phase Change Memories With Optimized $Ge_xSb_yTe_z$", IEEE Transactions on Electron Devices, vol. 60, Issue 12, pp. 4020-4026, Nov. 1, 2013 (7 pgs.).

*Primary Examiner* — Roy Potter
(74) *Attorney, Agent, or Firm* — Seed IP Law Group LLP

(57) ABSTRACT

A phase-change memory cell, comprising: a substrate housing a transistor, for selection of the memory cell, that includes a first conduction electrode; a first electrical-insulation layer on the selection transistor; a first conductive through via through the electrical-insulation layer electrically coupled to the first conduction electrode; a heater element including a first portion in electrical contact with the first conductive through via and a second portion that extends in electrical continuity with, and orthogonal to, the first portion; a first protection element extending on the first and second portions of the heater element; a second protection element extending in direct lateral contact with the first portion of the heater element and with the first protection element; and a phase-change region extending over the heater element in electrical and thermal contact therewith.

20 Claims, 15 Drawing Sheets

(52) U.S. Cl.
CPC ........ *H01L 45/126* (2013.01); *H01L 45/1233* (2013.01); *H01L 45/1293* (2013.01); *H01L 45/144* (2013.01); *H01L 45/1683* (2013.01)

(56) References Cited

U.S. PATENT DOCUMENTS

| | | |
|---|---|---|
| 2007/0278470 A1 | 12/2007 | Pellizzer et al. |
| 2011/0300685 A1 | 12/2011 | Horii et al. |
| 2013/0242649 A1* | 9/2013 | Pirovano ................ H01L 45/06 365/163 |
| 2015/0028283 A1 | 1/2015 | Redaelli et al. |
| 2015/0280117 A1 | 10/2015 | Boniardi et al. |
| 2016/0380190 A1* | 12/2016 | Boivin .................... H01L 45/06 257/2 |

* cited by examiner

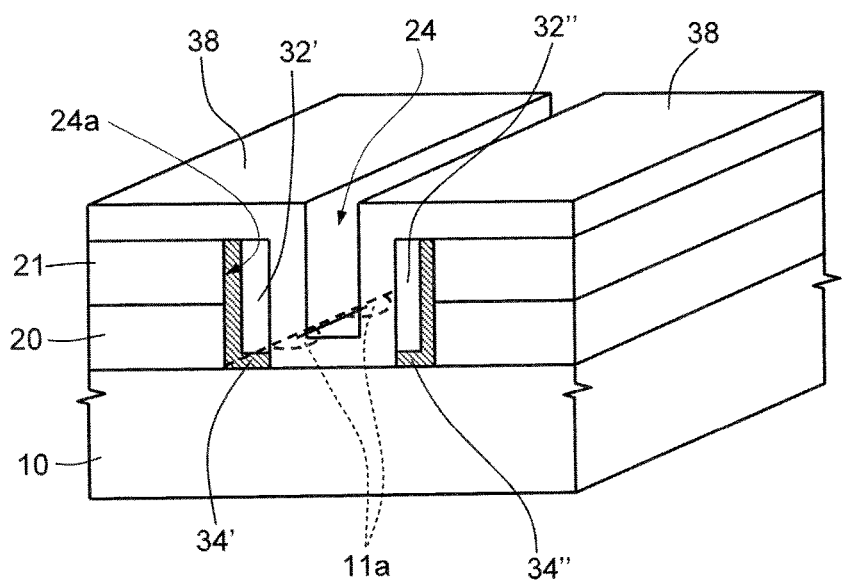
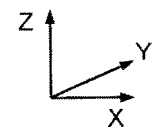
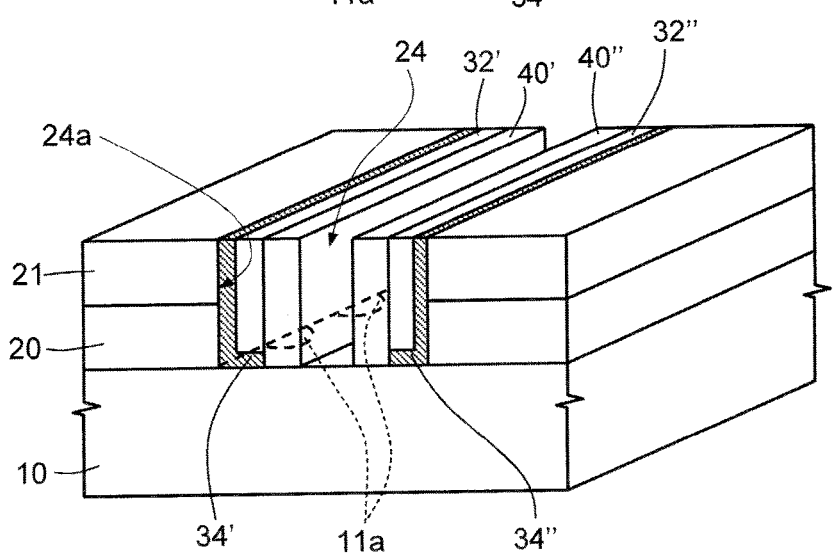
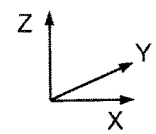
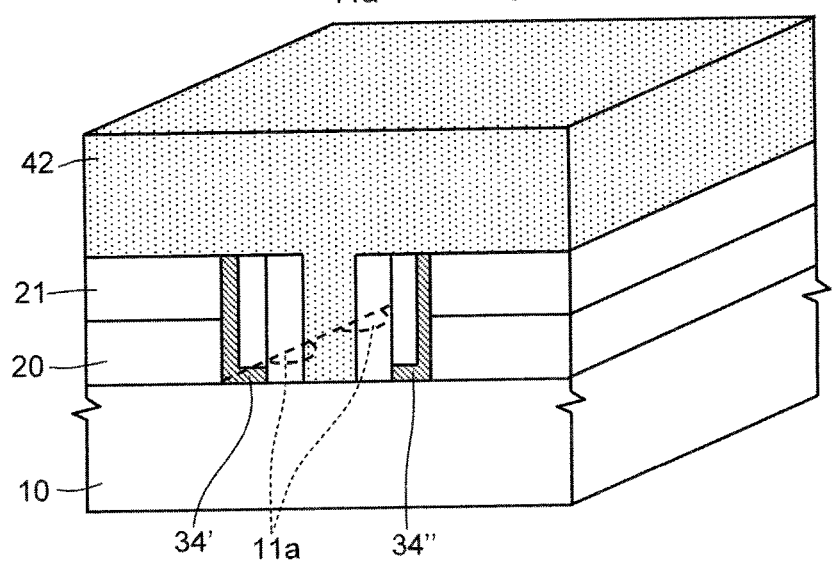
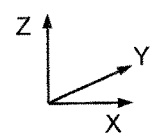

PHASE-CHANGE MEMORY CELL, AND METHOD FOR MANUFACTURING THE PHASE-CHANGE MEMORY CELL

BACKGROUND

Technical Field

The present disclosure relates to a phase-change memory cell and to a method for manufacturing the phase-change memory cell. In particular, the present disclosure relates to production of a heater of the phase-change memory cell.

Description of the Related Art

As is known, phase-change memories use a class of materials having the property of switching between two phases having distinct electrical characteristics, associated to two different crystallographic structures of the material, and precisely a non-orderly amorphous phase and an orderly crystalline or polycrystalline phase. The two phases are thus associated to values of resistivity that differ considerably from one another, even by two or more orders of magnitude.

Currently, the elements of Group XVI of the periodic table, such as for example Te or Se, also known as chalcogenide materials or chalcogenides, may be used in phase-change memory cells. As is known, for example, from P. Zuliani, et al., "Overcoming Temperature Limitations in Phase Change Memories With Optimized $Ge_xSb_yTe_z$", IEEE Transactions on Electron Devices, Volume 60, Issue 12, pages 4020-4026, Nov. 1, 2013, it is possible to use alloys of Ge, Sb, and Te ($Ge_xSb_yTe_z$, for example $Ge_2Sb_2Te_5$) optimized by appropriately choosing the percentages of the elements that form said alloys.

The temperature at which phase transition occurs depends upon the phase-change material used. In the case of $Ge_2Sb_2Te_5$ alloy, for example, below 150° C. both the amorphous phase and the crystalline phase are stable. If the temperature is increased beyond 200° C., there is noted a fast re-arrangement of the crystals, and the material becomes crystalline. To bring the chalcogenide into the amorphous state, one can increase further the temperature up to melting point (approximately 600° C.) and then cool it rapidly.

Numerous memories are known that exploit phase-change materials as elements for storage of the two stable states (amorphous and crystalline states), which may each be associated to a respective bit at "1" or at "0". In these memories, a plurality of memory cells are arranged in rows and columns to form an array. Each memory cell is coupled to a respective selection element, which may be implemented by any switching device, such as PN diodes, bipolar junction transistors, or MOS transistors, and typically includes a chalcogenide region in contact with a resistive contact, also known as heater. A storage element is formed in a contact area between the chalcogenide region and the heater. The heater is connected to a conduction terminal of the selection element.

In fact, from an electrical standpoint, the crystallization temperature and the melting temperature are obtained by causing flow of an electric current through the resistive contact that extends in direct contact with or is functionally coupled to the chalcogenide material, thus heating it by the Joule effect.

According to the prior art, various processes of production of phase-change memory cells are known, which, however, present some disadvantages and limitations. In particular, processes of a known type normally require numerous manufacturing steps to form the selection elements, the chalcogenide regions, the heaters, and the contacts for connecting the selection elements and the storage elements to the bitlines and to the wordlines. An example of embodiment of a phase-change memory device of this type is described, for example, in U.S. Pat. No. 7,422,926.

These problems have been partially solved by techniques of self-alignment of the chalcogenide regions, of the heaters, and of the contacts. However, the manufacturing steps, and in particular the precision for producing the heaters, as well as solutions for minimizing the contact area between the heaters and the chalcogenide regions (formation of heaters having a thickness and/or diameter of sublithographic dimensions) render the process for manufacture of this type of memory cells problematical, long, and easily subject to errors.

Further, there are increasingly efforts aimed at integrating phase-change memories in CMOS platforms provided with logic devices having a wide range of functions (e.g., microcontrollers), thus providing devices or circuits of an embedded type.

BRIEF SUMMARY

At least some embodiments of the present disclosure provide a phase-change memory cell and a method for manufacturing the phase-change memory cell that overcome the drawbacks set forth above.

At least one embodiment is a phase-change memory cell that includes:
 a substrate;
 a selection transistor in the substrate and including a first conduction electrode;
 a first electrical-insulation layer on the selection transistor;
 a first conductive through via through the electrical-insulation layer and electrically coupled to the first conduction electrode;
 a heater element including a first portion in electrical contact with the first conductive through via and a second portion that extends in electrical continuity with, and orthogonal to, the first portion;
 a first protection element extending on the first and second portions of the heater element;
 a second protection element extending in direct lateral contact with the first portion of the heater element and with the first protection element; and
 a phase-change region extending over, and in electrical and thermal contact with, the heater element.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIGS. 5-13 show an enlarged detail of the portion of wafer of FIG. 4, and regard manufacturing steps subsequent to that of FIG. 4;

DETAILED DESCRIPTION

Figure 1:
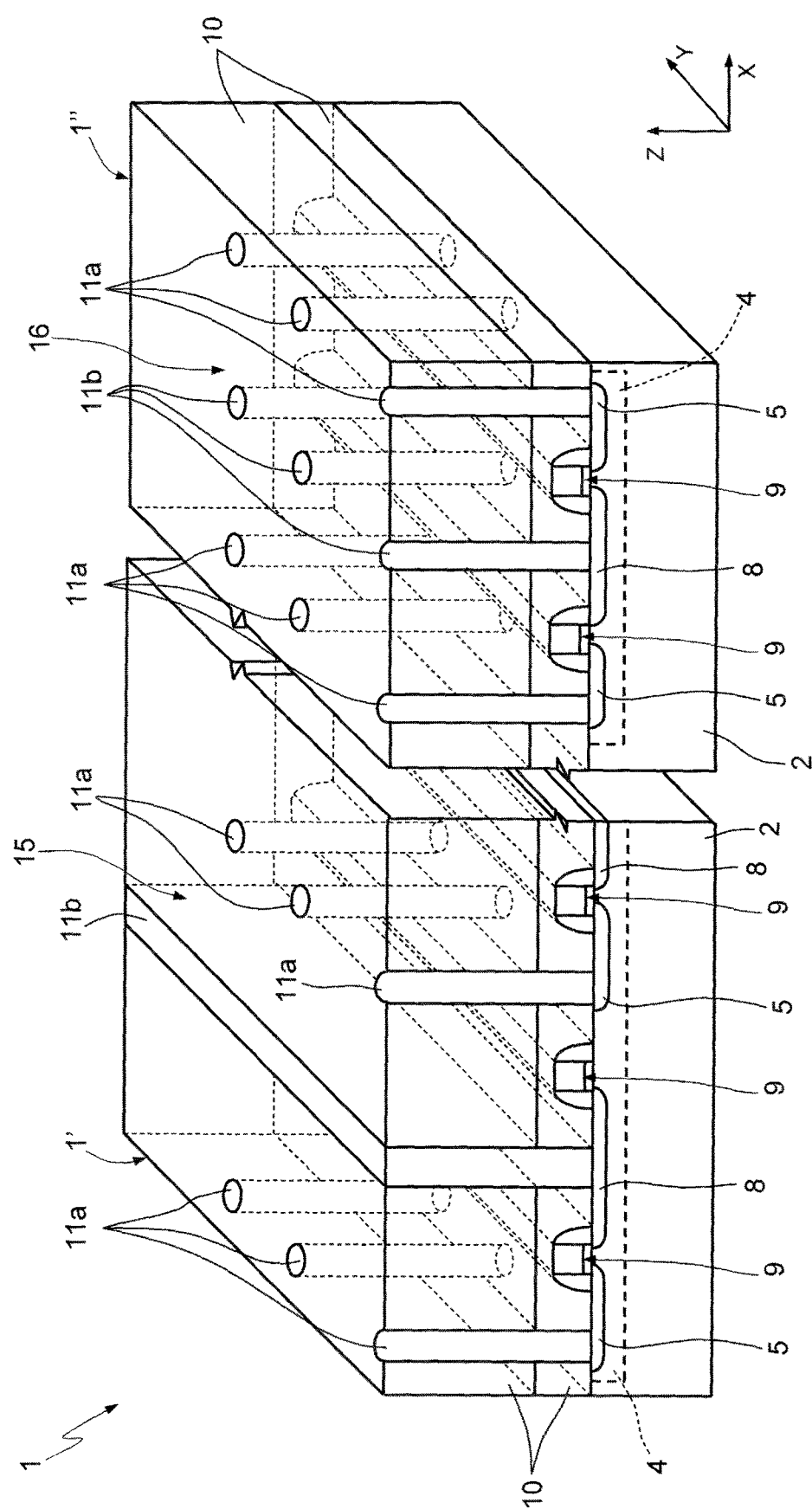
FIG. 1 is a perspective view of a portion of a wafer that houses a phase-change memory and a logic device, in an initial step of a manufacturing process.
Figure 2:
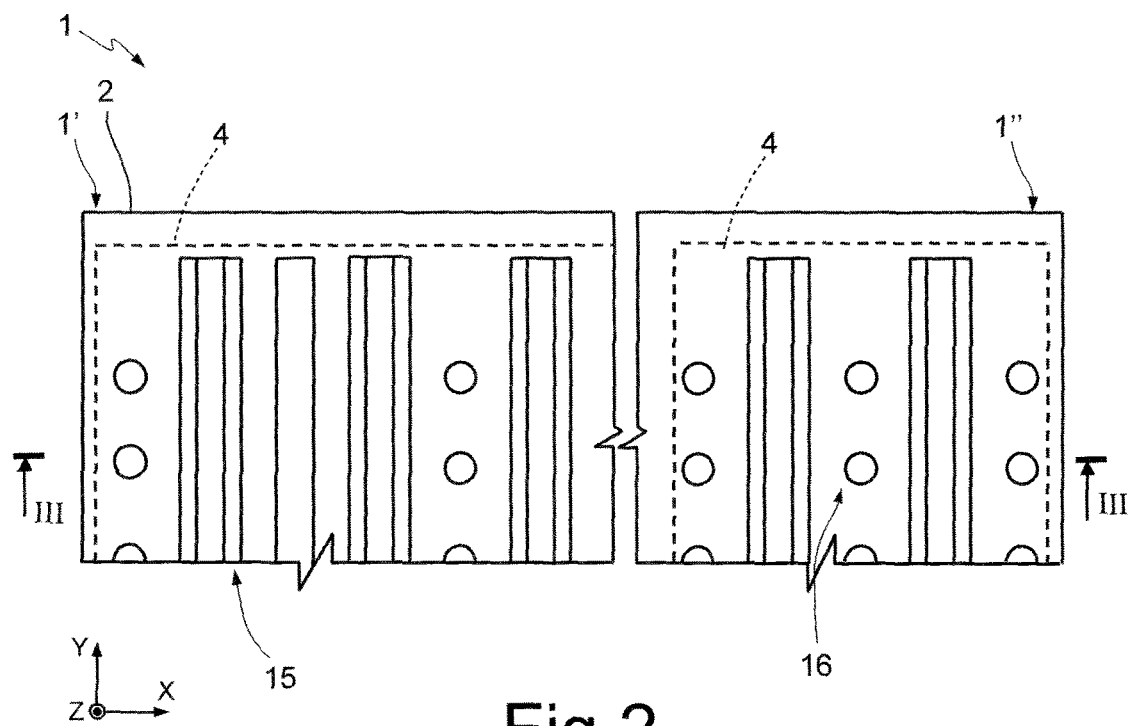
FIG. 2 is a top plan view of the portion of wafer of FIG. 1.
Figure 3:
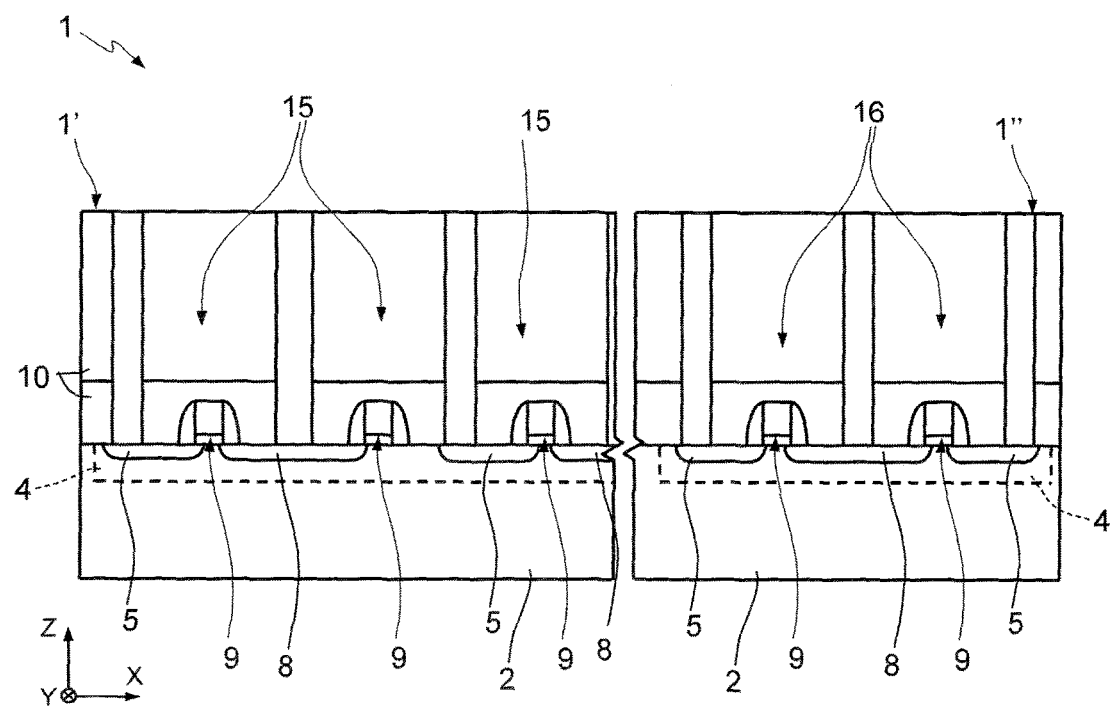
FIG. 3 is a lateral cross-sectional view of the portion of wafer of FIGS. 1 and 2, taken along the line of section of FIG. 2.

Illustrated with joint reference to FIG. 1 (perspective view), FIG. 2 (top plan view), and FIG. 3 (cross-sectional view along the line of section of FIG. 2) is a wafer 1 (in particular a portion of a wafer 1, for simplicity of representation). The wafer 1 is represented in a triaxial system X, Y, Z, in which the axes X, Y, and Z are mutually orthogonal.

The wafer 1, comprising a substrate 2, for example of a P type, is subjected to front-end processing steps of a standard type, in particular manufacturing steps of a CMOS process. In particular, formed in the substrate 2 are insulation regions (not illustrated), which delimit active areas 4. Then formed (e.g., implanted) in the active areas 4 are drain regions 5, source regions 8, and gate regions 9 of respective MOS transistors.

Next, one or more dielectric layers 10 are deposited and planarized, for electrical insulation of the gate regions 9, typically a pre-metal dielectric (PMD) layer. Openings are formed in the dielectric layer 10 over the drain regions 5 and the source regions 8, and said openings are filled with tungsten to form a plurality of plugs, having the function of drain contacts 11a and source contacts 11b of the aforementioned MOS transistors. The drain contacts 11a are, in particular, in electrical contact with the implanted drain regions 5, and the source contacts 11b are in electrical contact with the implanted source regions 8.

In a per se known manner, the openings formed in the dielectric layer 10 may be covered by a first barrier layer, for example a Ti/TiN layer, before being filled with tungsten.

The left-hand side of the representation of the wafer 1 in FIG. 1 is dedicated to creation of a phase-change memory and will consequently be identified, in the sequel of the description, as memory side 1'; the right-hand side of the representation of the wafer 1 in FIG. 1 is dedicated to creation of a logic device 16, which is to form an embedded circuit integrated in the same chip as the one that houses the phase-change memory and will consequently be identified, in the sequel of the description, as logic side 1". It is evident that the use of the terms "right-hand" and "left-hand" has exclusively purposes of description with reference to the view of the figures and is in no way limiting for the purposes of the present disclosure.

The drain regions 5, the source regions 8, and the gate regions 9 formed on the memory side 1' form selection transistors 15 of an nMOS type for cells of the phase-change memory, whereas the source regions 8 and the gate regions 9 formed on the logic side 1" form transistors of the logic device 16.

As may be noted, the source contact 11b of each selection transistor 15 extends in a continuous way in the direction of the axis Y, parallel to the gate regions 9. This embodiment presents the advantage of enabling electrical contact of the gate regions 9 and of the source contacts 11b in a dedicated area of the wafer 1, thus simplifying routing of the metal levels of the memory.

The drain contacts 11a extend in the form of pillars and so that drain contacts 11a belonging to one and the same selection transistor 15 are aligned with respect to one another in the direction Y. Drain contacts 11a belonging to different selection transistors extend aligned with respect to one another in the direction X.

Once the steps for formation of the selection transistors 15 (memory side 1') and of the transistors of the logic device 16 (logic side 1") are completed, a protective layer 20, for example of silicon nitride $Si_3N_4$, and a dielectric layer 21, for example of silicon oxide $SiO_2$, are deposited on the wafer 1 and then defined by lithographic and etching steps to form trenches 24 on the memory side 1'. The trenches 24 have a main (major) extension along Y and a secondary (minor) extension along X.

In each trench 24 there are exposed respective top faces of drain contacts 11a, which are aligned with respect to one another along one and the same direction parallel to the direction Y.

More in particular, the steps of lithography and etching of the protective layer 20 and of the dielectric layer 21 are carried out so that a side wall 24a of each trench 24 extends alongside, or partially over, the top faces of the drain contacts 11a. The latter are thus completely or partially exposed through the respective trench 24. The fact that the top faces of the drain contacts 11a are exposed only partially guarantees a certain safety margin in the case of alignment errors. In this way, the problems regarding the fact that the wall 24a could extend at an excessive distance, in the direction X, from the top faces of the drain contacts 11a are solved. It is in fact convenient for the side wall 24a of each trench 24 to extend (even in the case of misalignments) adjacent to, or in the proximity of, respective drain contacts 11a. Acceptable distances between the wall 24a and the center (or centroid) of the drain contacts 11a, measured along X, are, for example, comprised between 0 nm (condition of contiguity or partial overlapping) and 30 nm.

It should be noted that the steps of deposition of the protective layer 20 and of the dielectric layer 21 are carried out over the entire wafer 1, and thus also on the logic side 1" of the wafer 1. The portions of the protective layer 20 and dielectric layer 21, which extend on the logic side 1", will then be removed.

Illustrated with reference to FIGS. 5-9 is a method of production of a heater within the trenches 24, according to one aspect of the present disclosure. For simplicity of representation, FIGS. 5-9 regard a portion of a trench 24. It is evident that what has been described with reference thereto applies to all the trenches 24 provided in the wafer 1 on the memory side 1'.

First of all (FIG. 5), a step of deposition of a resistive layer 26, for example silicon and titanium nitride (TiSiN), is carried out to cover the wafer 1 and in particular the walls and the bottom of the trench 24. The resistive layer 26 extends over the side wall 24a and in direct contact with the top face of the drain contacts 11a exposed through the trench 24.

Since the material used for the resistive layer 26 tends to undergo fast oxidation in air and thus its own electrical characteristics tend to deteriorate, a step is carried out of deposition of a protective layer 28, for example of dielectric material such as silicon nitride ($Si_3N_4$), on the resistive layer 26, in particular on the side wall 24a of the trench 24. The protective layer 28 has a thickness, measured along X on the side wall 24a, of some tens of nanometers, for example between 20 and 100 nm, or in any case a thickness greater than the distance, along X, between the side wall 24a and the drain contacts 11a that extend in the trench 24 considered.

Then (FIG. 6), a first step of dry etching of the protective layer 28 is carried out, for example anisotropic plasma etching, in the direction of the arrows 29 (i.e., in the direction Z). This first etch enables removal of portions of the protective layer 28 that extend parallel to the plane XY, maintaining the portions thereof that extend parallel to the plane YZ, i.e., on the side walls inside the trench 24 and in particular on the side wall 24a, substantially unaltered. The protection walls 32' and 32" of FIG. 6 are thus formed.

Figure 6:
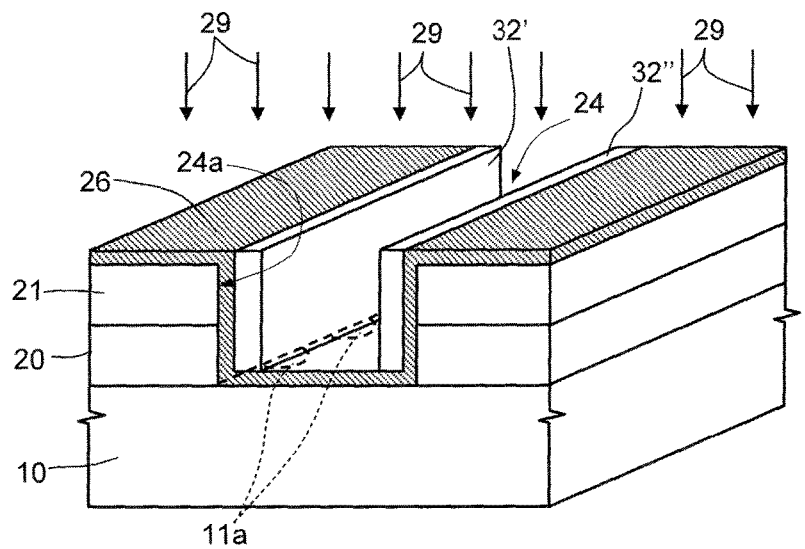
Figure 7:
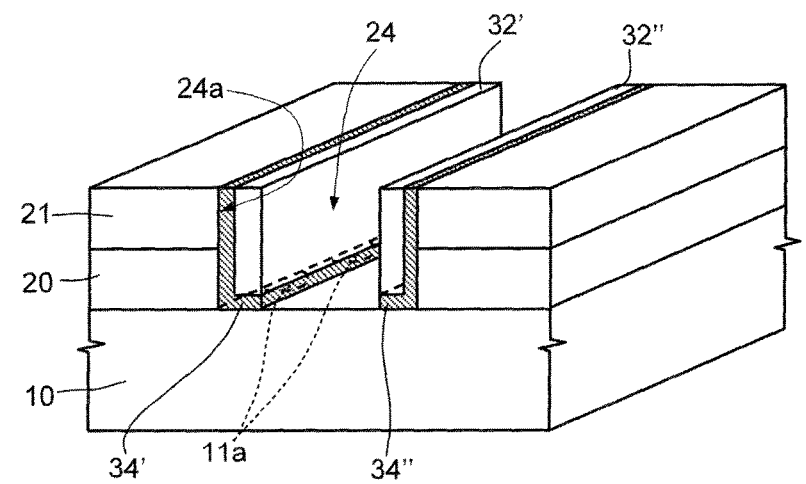

Via an appropriate choice of the thickness of the protective layer 28, after the etching step of FIG. 6, the extension in the direction X of the protection wall 32' on the side wall 24a of the trench 24 is such as to overlie at least in part (in top plan view) the top faces of the drain contacts 11a. In this way, during subsequent removal of selective portions of the resistive layer 26, also the regions of the latter that extend underneath the protection walls 32', 32" will at least in part overlie (and, more in particular, will be in direct electrical contact with) the drain contacts 11a. This step is illustrated with reference to FIG. 7 and may be carried out simultaneously with the step of etching of the protective layer 28 or else in a separate and subsequent etching step. Selective portions of the resistive layer 26 are thus removed from the wafer 1 except for the regions thereof protected (masked) by the protection walls 32', 32".

Resistive regions 34' and 34" are thus formed, which are, in lateral cross-sectional view in the plane XZ, substantially L-shaped and cover the side walls of the trench 24 (longer leg of the L) and, in part, the bottom of the trench 24 (shorter leg of the L). The resistive region 34' extends over the side wall 24a of the trench 24 and proceeds, with electrical continuity, until it electrically contacts, at least partially, the drain contacts 11a. Preferably, the resistive region 34' extends over the bottom wall of the trench 24 entirely covering the drain contacts 11a. The resistive regions 34', 34" present, following upon the step of FIG. 7, exposed regions at the bottom of the trench 24, where coverage of the protection walls 32', 32" is not present.

Next (FIG. 8), a step of deposition on the wafer 1 of a further protective layer 38, for example silicon nitride ($Si_3N_4$), is carried out. The protective layer 38 has a thickness, measured along X on the side wall 24a, of some tens of nanometers, for example between 10 and 60 nm, and in any case a thickness such as not to occlude the trench 24 completely.

Then (FIG. 9), a dry etching step is carried out to remove the protective layer 38 from the front of the wafer 1 and partially from the trench 24 except for portions of the protective layer 38 that extend coplanar to the protection walls 32', 32".

Further protection walls 40', 40" are thus formed, which extend in the trench 24 in contact with the protection walls 32', 32" and with the exposed portions of the resistive regions 34', 34" that derive from the previous etching step. In this way, the resistive regions 34', 34" are effectively and completely protected from oxidation phenomena.

Next (FIG. 10), a step is carried out of deposition of dielectric material, in particular silicon oxide, $SiO_2$, on the wafer 1, to form a filling layer 42 that extends over the wafer 1 and fills the trench 24 completely. Portions of the filling layer 42 that extend outside the trench 24 are removed by a step of chemical mechanical polishing (CMP). CMP is carried out over the entire wafer 1.

Figure 11:
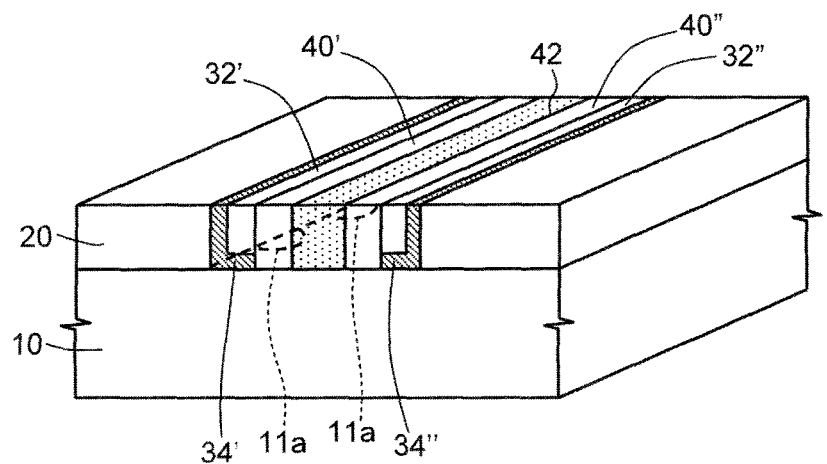

With reference to FIG. 11, the CMP step completely removes the filling layer 42 that extends outside the trench 24 and thus completely removes, from the entire wafer 1, also the dielectric layer 21, stopping at the protective layer 20. If the CMP step proceeds beyond the dielectric layer 21, any possible removal of a minimal top portion of the protective layer 20 does not involve significant problems. During the step of removal of the dielectric layer 21, the CMP technique is not, in practice, selective in regard to the $Si_3N_4$ layers and to the material used for the resistive layer 26 that extend in the trench 24, which are thus also removed partially until the maximum height, along Z, to which the protective layer 20 extends is reached. The thickness of the protective layer 20 and the duration of the CMP process thus define the maximum extension, along Z, of the resistive regions 34', 34" and of the protection walls 32', 32" and 40', 40".

Figure 12:
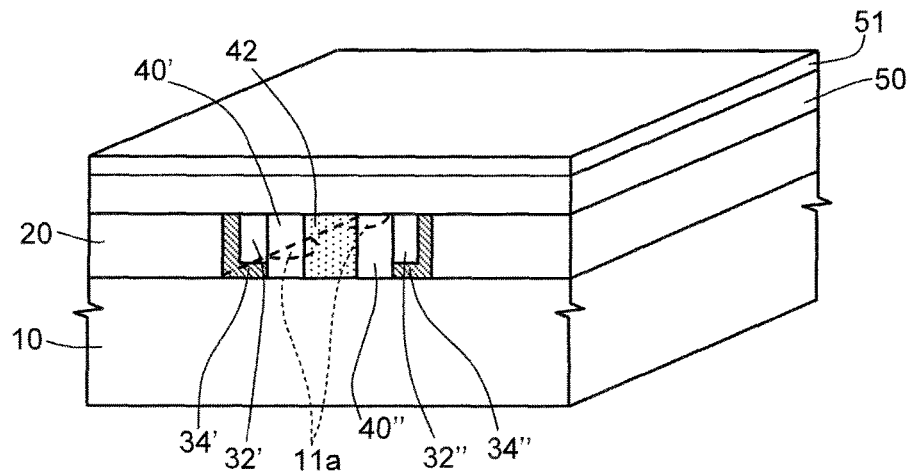

This is followed by formation (FIG. 12), in a per se known manner, of a layer of phase-change material (in what follows, "PCM layer") 50, for example by depositing a chalcogenide, such as a GST (Ge—Sb—Te) compound, e.g., $Ge_2Sb_2Te_5$. Other phase-change materials may be used. Formation of the PCM layer 50 is carried out over the entire wafer 1. A barrier layer 51, of metal material, for example TiN, is formed on the PCM layer 50 to protect the PCM layer 50 from oxidation phenomena and likewise to form a low-resistivity layer for subsequent electrical-contact steps.

This is then followed (FIG. 13) by deposition of an etch-protection layer, or "hard mask", 52 (made, for example, of silicon nitride) and by lithographic and etching steps in order to remove selective portions of the barrier layer 51 and of the PCM layer 50 exposed through the hard mask 52 to create resistive bitlines 54 on the memory side 1'. Etching proceeds in the direction Z with removal of exposed portions of the protective layer 20 between adjacent resistive bitlines 54. In this step, selective portions of the resistive regions 34', 34", of the protection walls 32', 32", of the protection walls 40', 40", and of the filling layer 42 that extend, in top plan view XY, between one resistive bitline 54 and an adjacent one are likewise removed.

Figure 4:
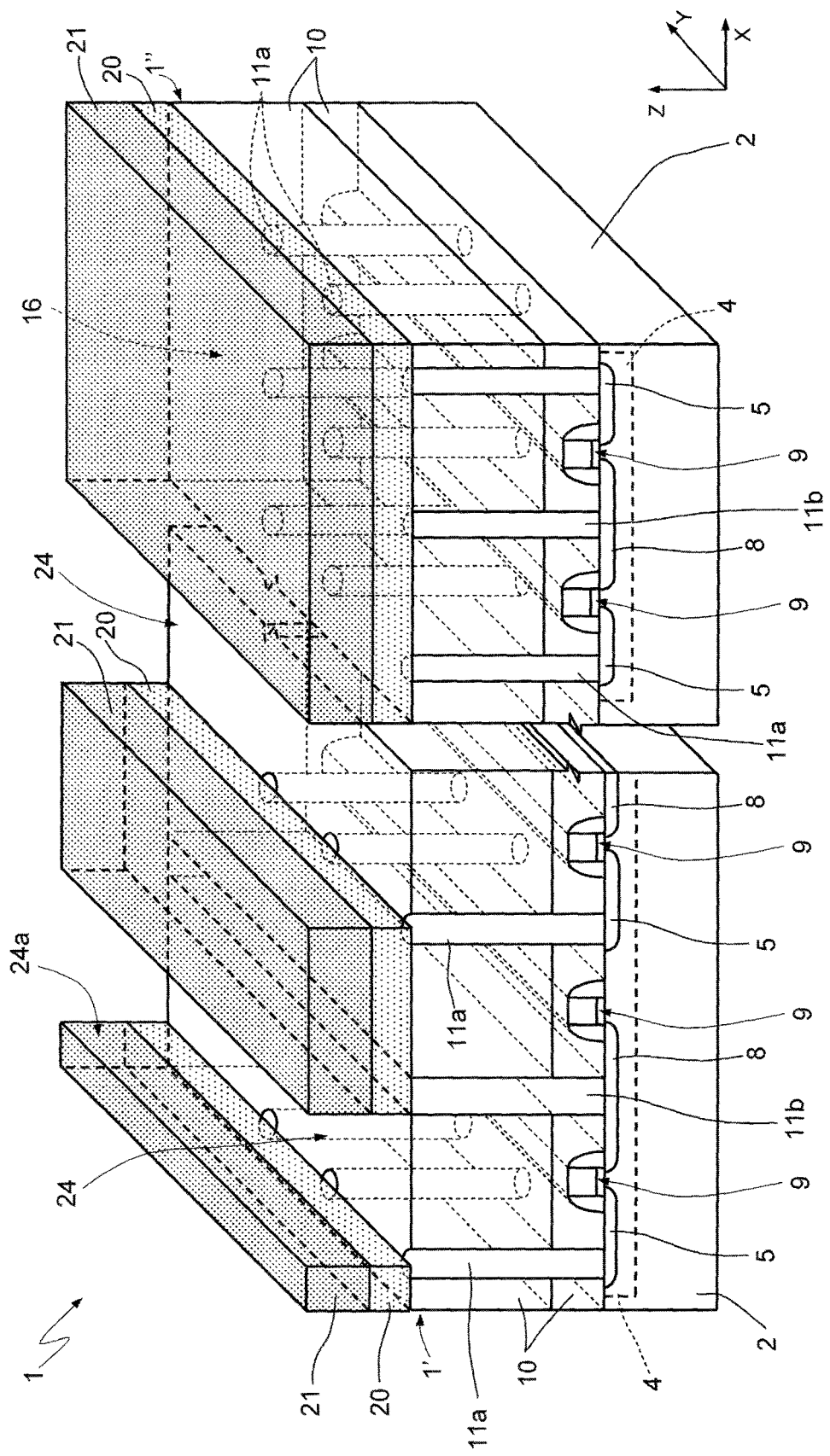
FIG. 4 is a perspective view of the portion of wafer of FIG. 1, in a subsequent manufacturing step.
Figure 5:
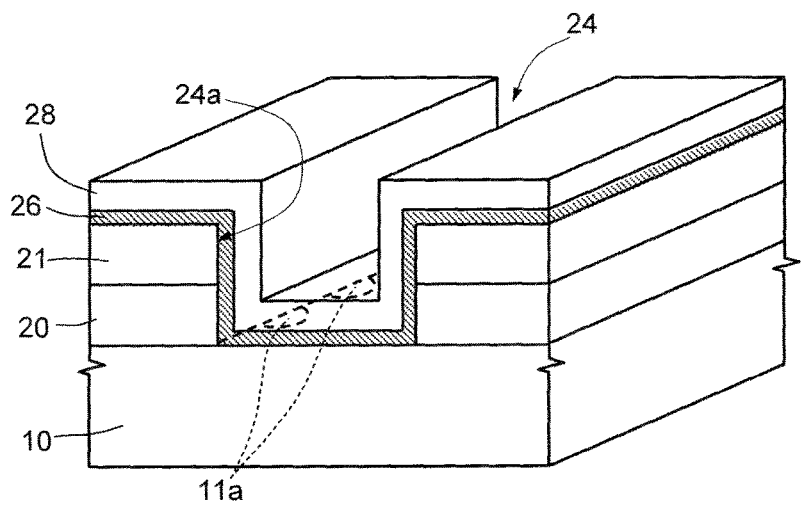
Figure 13:
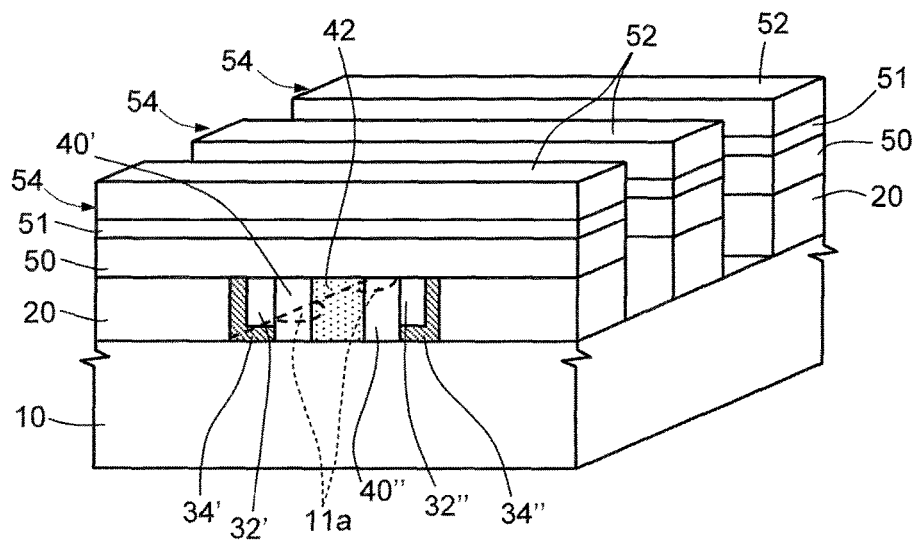
Figure 14:
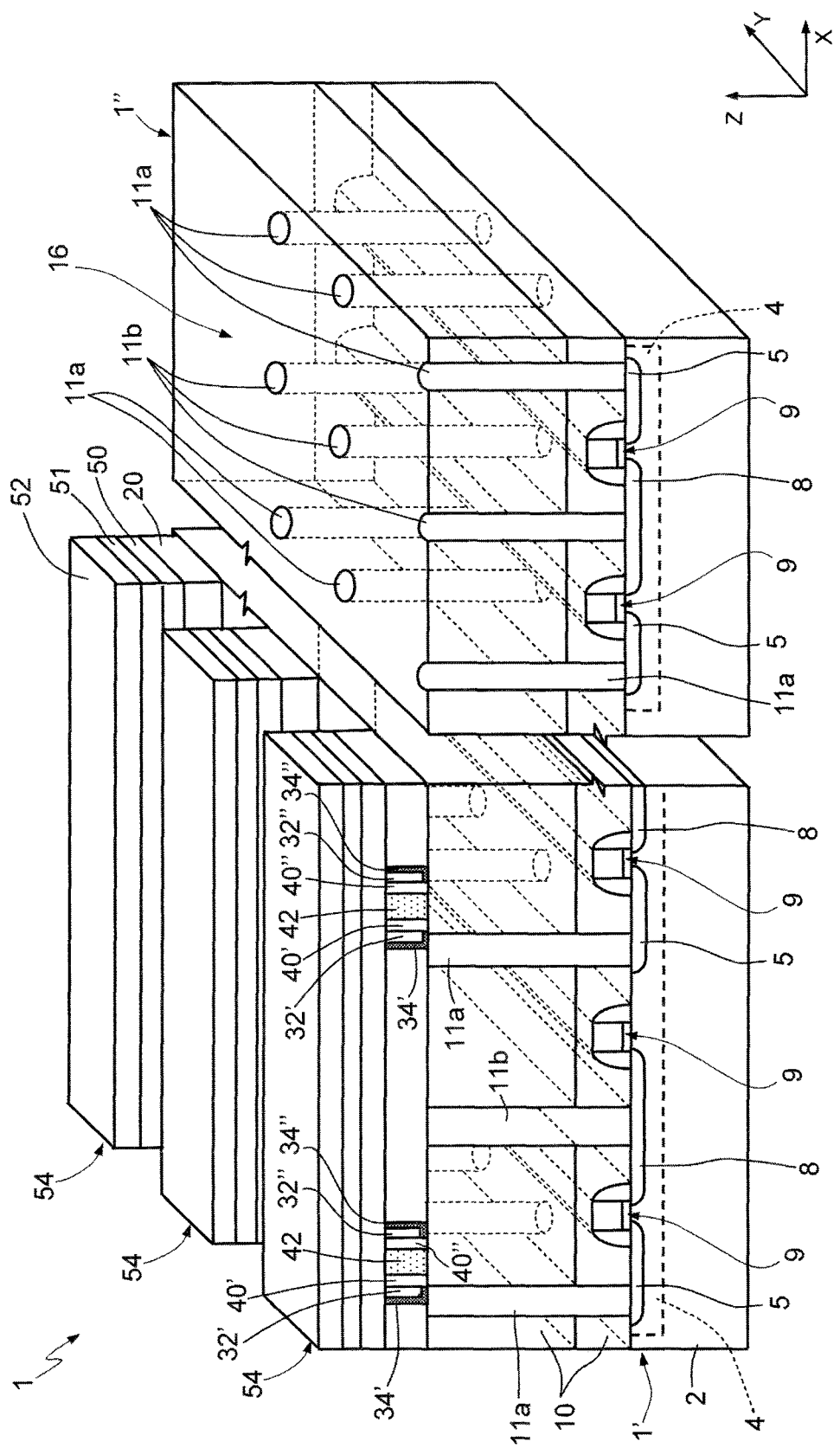
FIG. 14 reproduces the same perspective view as that of FIGS. 1 and 4, and illustrates a manufacturing step subsequent to that of FIG. 13.
Figure 15:
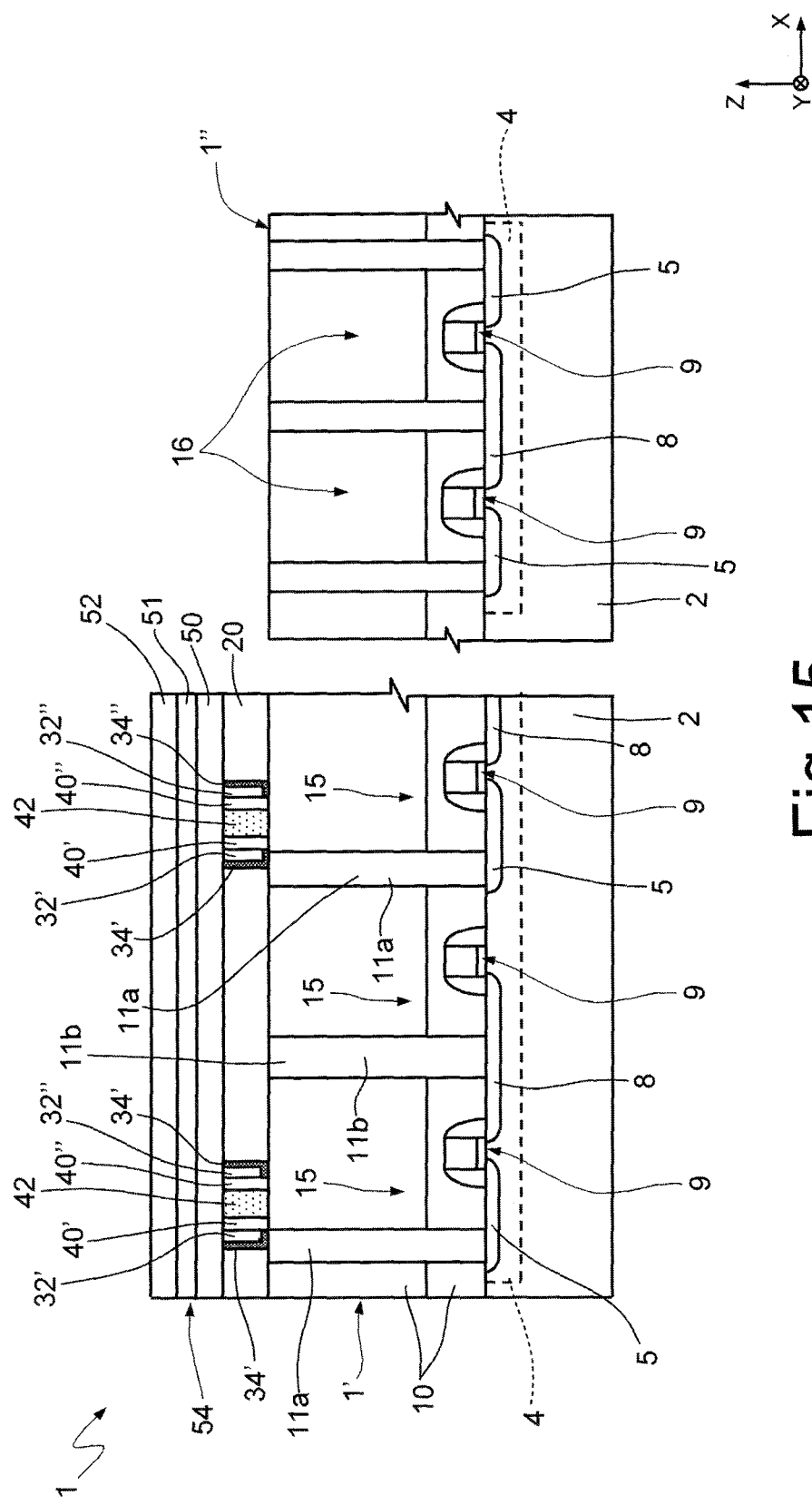
FIG. 15 illustrates the portion of wafer of FIG. 14 in lateral cross-sectional view.

FIG. 14 is a perspective view, which reproduces the view of FIGS. 1 and 4, of the wafer 1 after the manufacturing steps described with reference to FIG. 13, and FIG. 15 is a lateral cross-sectional view in the plane XZ, which reproduces the view of the portion of the wafer 1 illustrated in FIG. 14.

According to an embodiment alternative to the one illustrated in FIG. 14, the resistive bitlines 54 have locally widened regions, i.e., regions having an extension, along Y, that is locally increased. These regions are formed, for example, at the source contact 11b on the memory side 1' or in any case in the regions where, in subsequent manufacturing steps (see FIGS. 18 and 19), conductive vias will be formed to provide a top electrical contact in order to enable electrical access to the resistive bitlines 54. The locally widened regions have the functions of compensating for possible undesired misalignments.

As illustrated in FIGS. 13-15, the resistive bitlines 54, of chalcogenide, extend electrically separate from one another in the direction X, each of them in thermal contact with a plurality of resistive regions 34'. Each of said resistive regions 34' is, in turn, in electrical contact with a respective drain contact 11a and forms, in use, a heater designed to generate, when traversed by electric current, heat by the Joule effect having a value such as to cause phase change in a respective portion of the resistive bitline to which it is thermally coupled.

It may be noted that, since the resistive regions 34" are not electrically coupled to any drain contact 11a, or to other electrical contacts, they do not play an active role during use of the memory array.

Following upon the steps of FIGS. 14 and 15, the hard mask 52 may then be removed. However, since it does not generate problems during subsequent processing steps, the step of removal of the hard mask 52 is optional.

Figure 16:
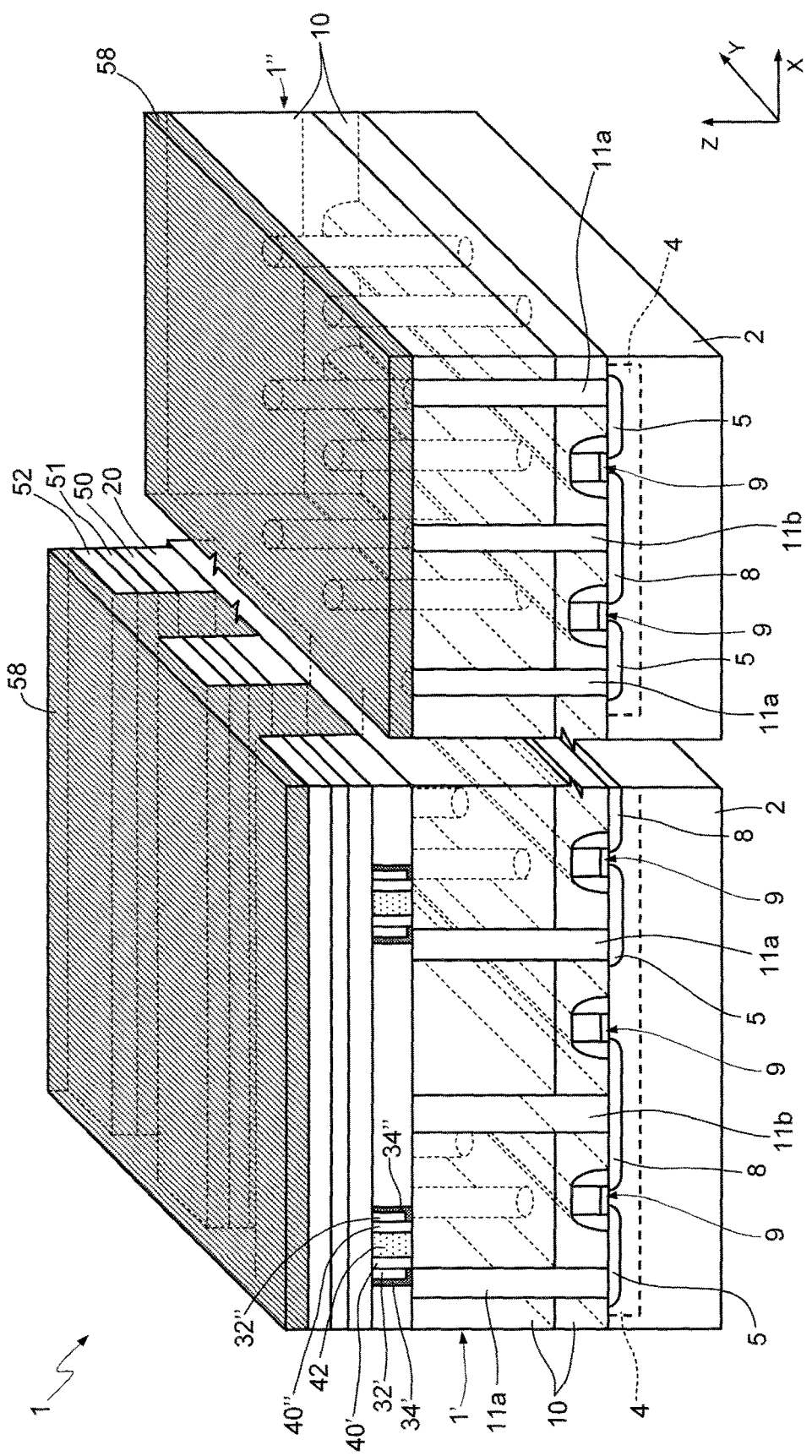
FIG. 16 shows, in perspective view, the portion of wafer of FIG. 14 in a manufacturing step subsequent to that of FIG. 14.
Figure 17:
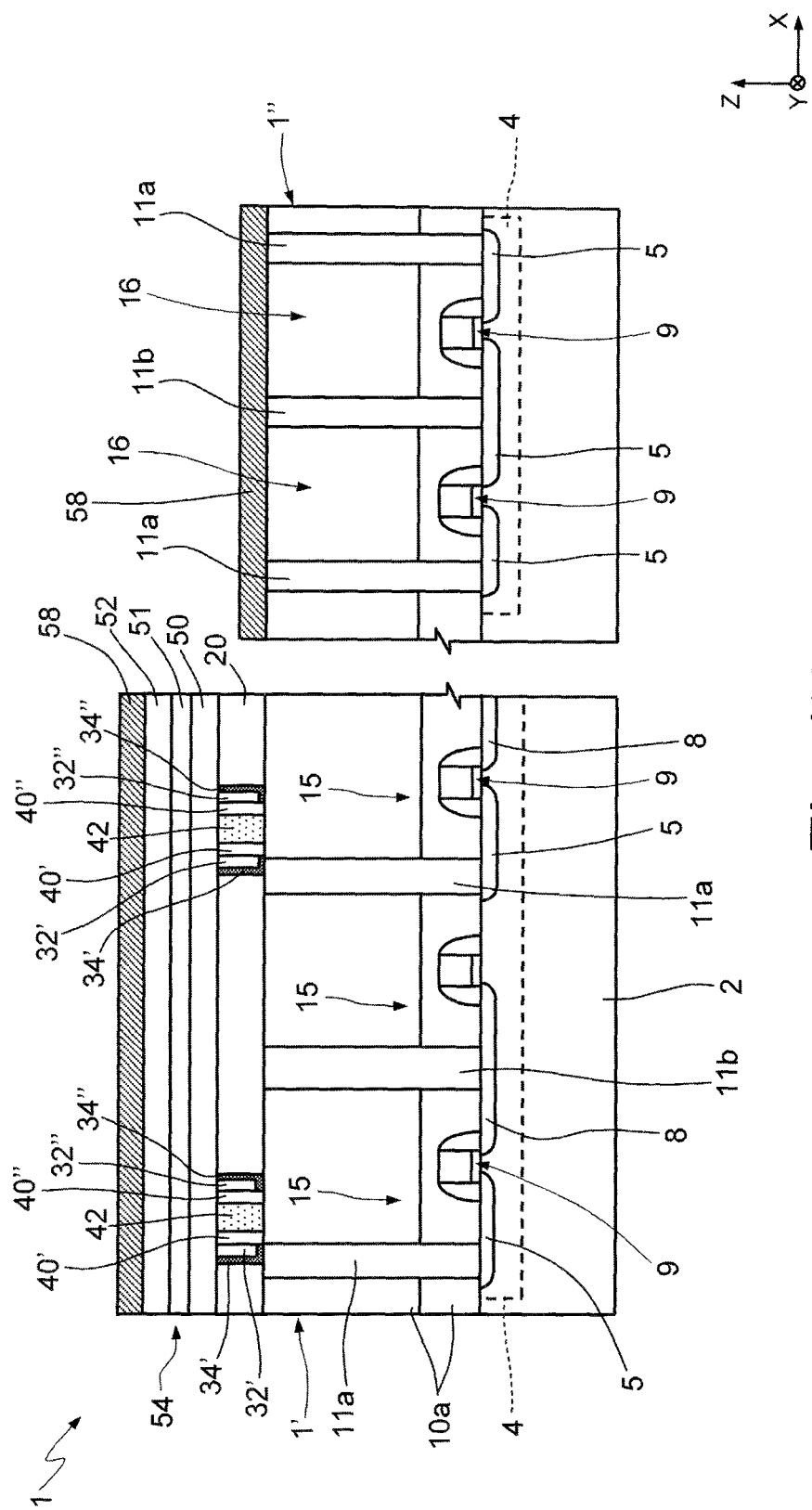
FIG. 17 illustrates the portion of wafer of FIG. 16 in lateral cross-sectional view.

Then (FIGS. 16 and 17), deposited on the wafer 1 is a sealing layer 58 of dielectric material, for example silicon nitride, having the function of protection of the chalcogenide material from exposure to air and of electrical insulation between the resistive bitlines 54. The sealing layer 58 is deposited on the hard mask 52 and in the gaps between one resistive bitline 54 and the adjacent one. The sealing layer 58 is likewise deposited on the logic side 1", on the dielectric layer 10, and on the drain contacts 11a and source contacts 11b exposed through the dielectric layer 10 on the logic side 1".

The resistive bitlines 54 are not suited to being used for conveying electrical signals for selection of the memory cells to be read/written in so far as their resistivity is too high. It is thus expedient to proceed with formation of conductive bitlines, of metal material, in electrical contact with the resistive bitlines 54 through conductive vias.

Figure 18:
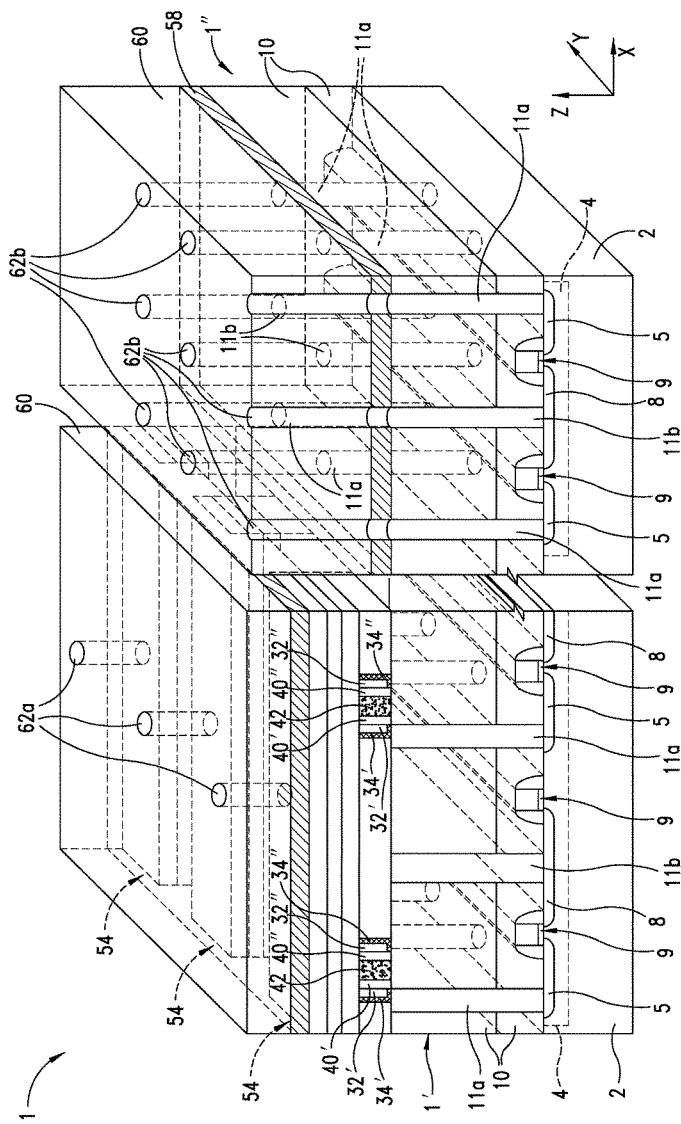
FIG. 18 is a perspective view of the portion of wafer of FIG. 16 in a manufacturing step subsequent to that of FIG. 16.
Figure 19:
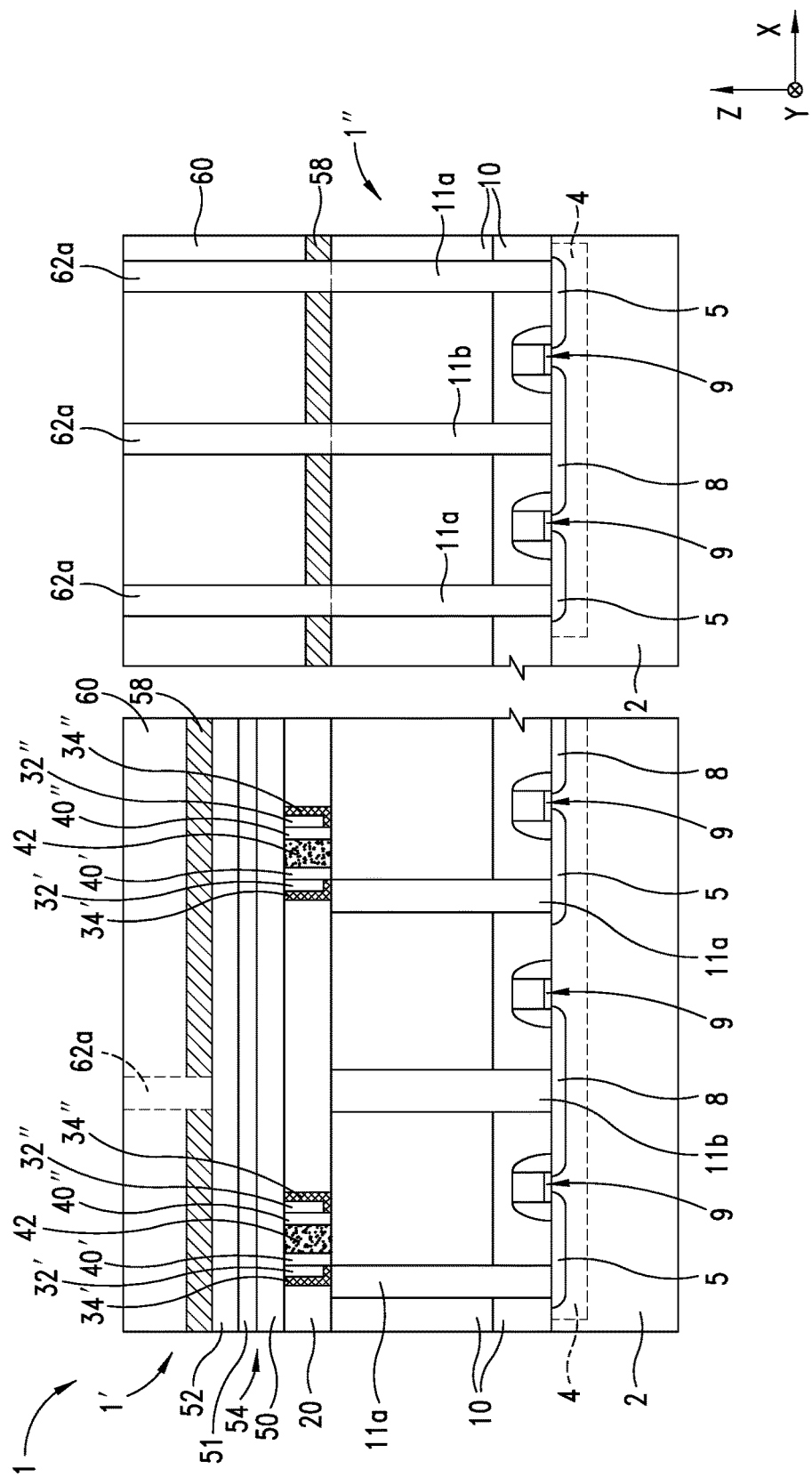
FIG. 19 illustrates the portion of wafer of FIG. 18 in lateral cross-sectional view.

For this purpose, as illustrated in FIGS. 18 and 19, a dielectric layer 60, for example a silicon-oxide layer, is deposited on the wafer 1, over the sealing layer 58, and, by lithographic and etching steps, a plurality of openings 62a, 62b are formed in the dielectric layer 60. The openings 62a are formed on the memory side 1', aligned, along Z, to respective resistive bitlines 54, so that each opening 62a forms a path towards a respective resistive bitline 54. The openings 62a are preferably formed at a distance from the heater, for example, at the source contacts 11b.

By choosing the materials of the sealing layer 58 and of the dielectric layer 60 such that they may be etched selectively with respect to one another, the sealing layer 58 has the function of etch-stop layer during the step of formation of the openings 62a, 62b.

Formation of the openings 62a thus includes selective removal of the dielectric layer 60 until surface portions of the sealing layer 58 are exposed, and removal of the portions of the sealing layer 58 thus exposed. In the case where the hard mask 52 has not been removed in previous manufacturing steps, it is expedient to remove the portions of hard mask 52 exposed through the openings thus formed, until surface regions of the barrier layer 51 are reached and exposed.

The openings 62b are formed on the logic side 1" so that each opening 62b is aligned, along Z, with a respective drain contact 11a and source contact 11b (there may be used for this purpose alignment marks, in a per se known manner). The openings 62b have in fact the function of forming, during subsequent manufacturing steps, conductive paths in electrical contact with the drain contacts 11a and source contacts 11b on the logic side 1".

Formation of the openings 62b thus includes selective removal of the dielectric layer 60 on the logic side 1" until surface portions of the sealing layer 58 are exposed, and removal of the portions of the sealing layer 58 thus exposed, until the drain contacts 11a and source contacts 11b are reached and exposed.

Formation of the openings 62a and 62 is advantageously carried out using a single etching mask.

This is followed by a step of filling with conductive material, for example metal material, of the openings 62a, 62b to form conductive vias in electrical contact with the resistive bitlines 54 (memory side 1') and with the drain contacts 11a and source contacts 11b (logic side 1").

Figure 20:
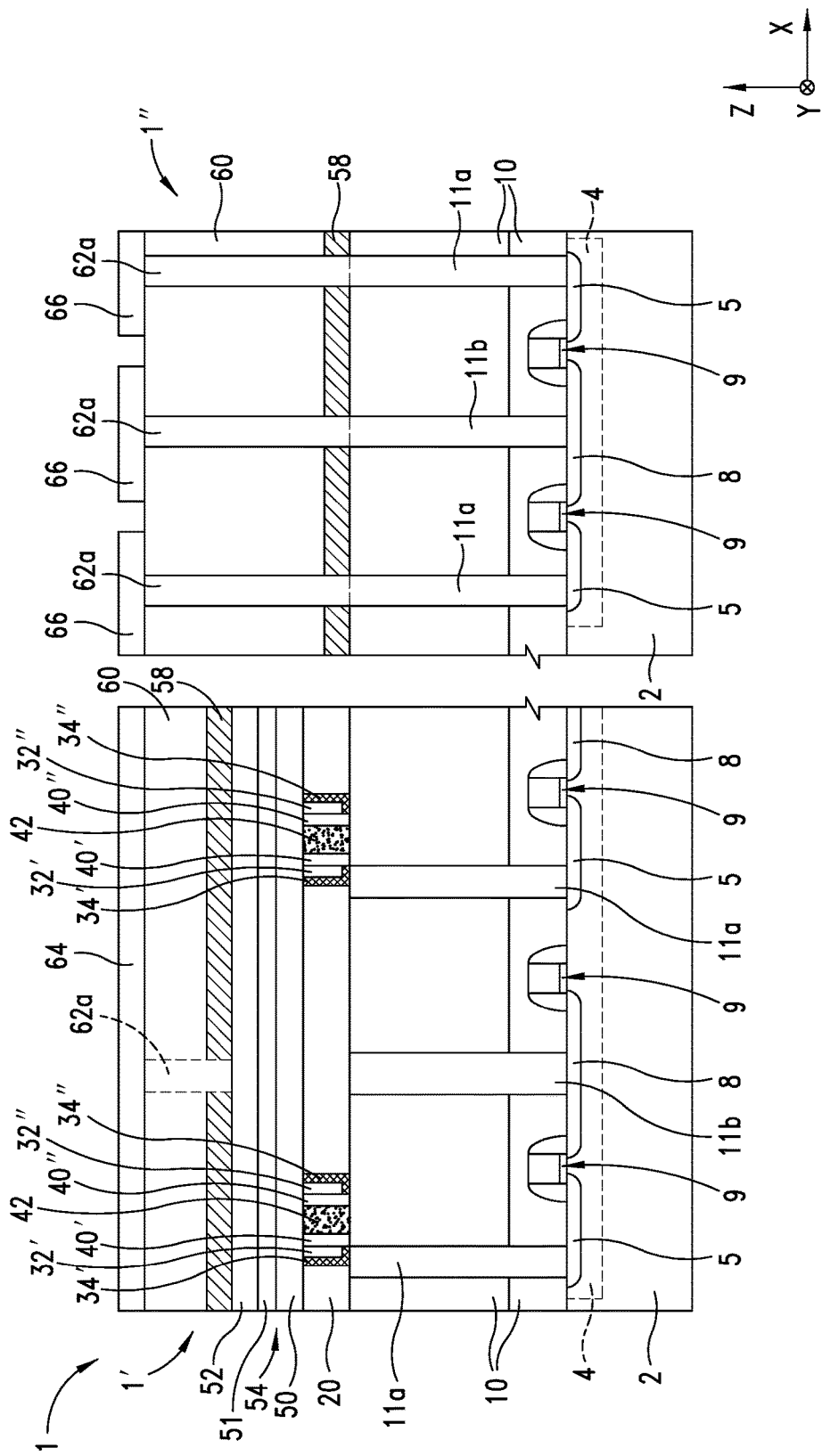
FIG. 20 is a lateral cross-sectional view of the portion of wafer of FIG. 19 in a manufacturing step subsequent to that of FIG. 19.

After a step of cleaning of the front of the wafer 1 in order to remove the metal layer formed therein during filling of the openings 62a, 62b, it is possible to proceed with processing steps of a known type. In particular, FIG. 20, there are formed conductive bitlines 64 on the front of the wafer 1 (memory side 1') and paths 66 for routing of the signals (logic side 1"), according to a desired pattern that does not form the subject of the present disclosure. In particular, each conductive bitline 64 extends parallel and aligned, along Z, to a respective resistive bitline 54.

Figure 21:
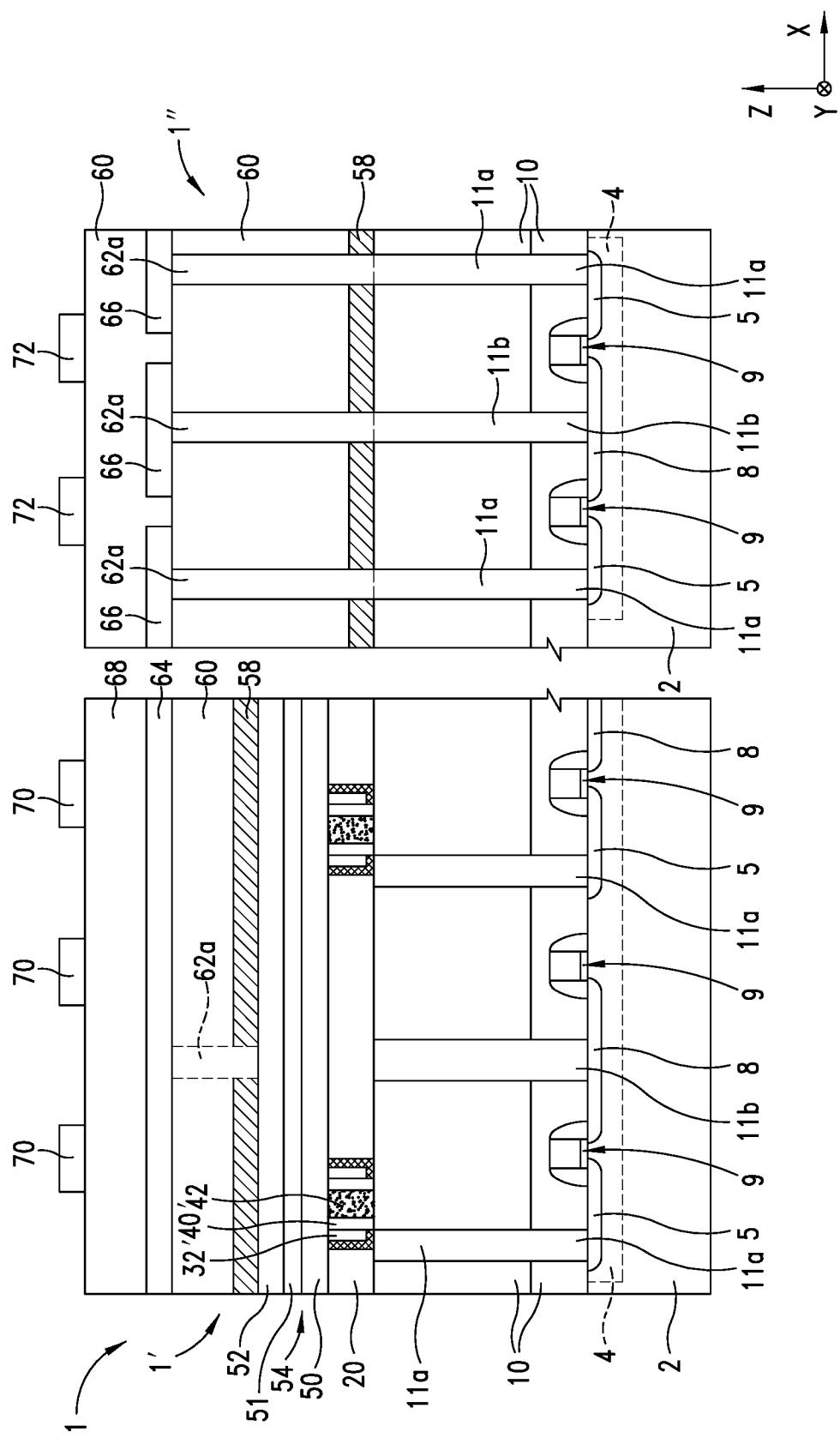
FIG. 21 is a lateral cross-sectional view of the portion of wafer of FIG. 20 in a manufacturing step subsequent to that of FIG. 20.

This is followed, as illustrated in FIG. 21, by a step of deposition of a further dielectric layer 68 on the wafer 1, over the conductive bitlines 64 and the paths 66, and a step of deposition and photolithographic definition of a metal layer, for formation of wordlines 70 on the memory side 1'. The wordlines 70 are electrically coupled to the gate regions 9 by conductive vias (not illustrated), which extend through the dielectric layer 68 and the dielectric layer 60. Metal paths 72 may likewise be formed on the dielectric layer 68 on the logic side 1".

The thickness of inter-metal layer 60 is not the same in the memory and logic regions. It is defined at the same quota, so a thickness approximately doubled is obtained in the logic. Opening 62a and 62b are consequently of very different height (62b twice 62a). Furthermore metallization levels 64 and 66 are the same quota, and also levels 70 and 72 are basically the same metal layer.

Figure 22:
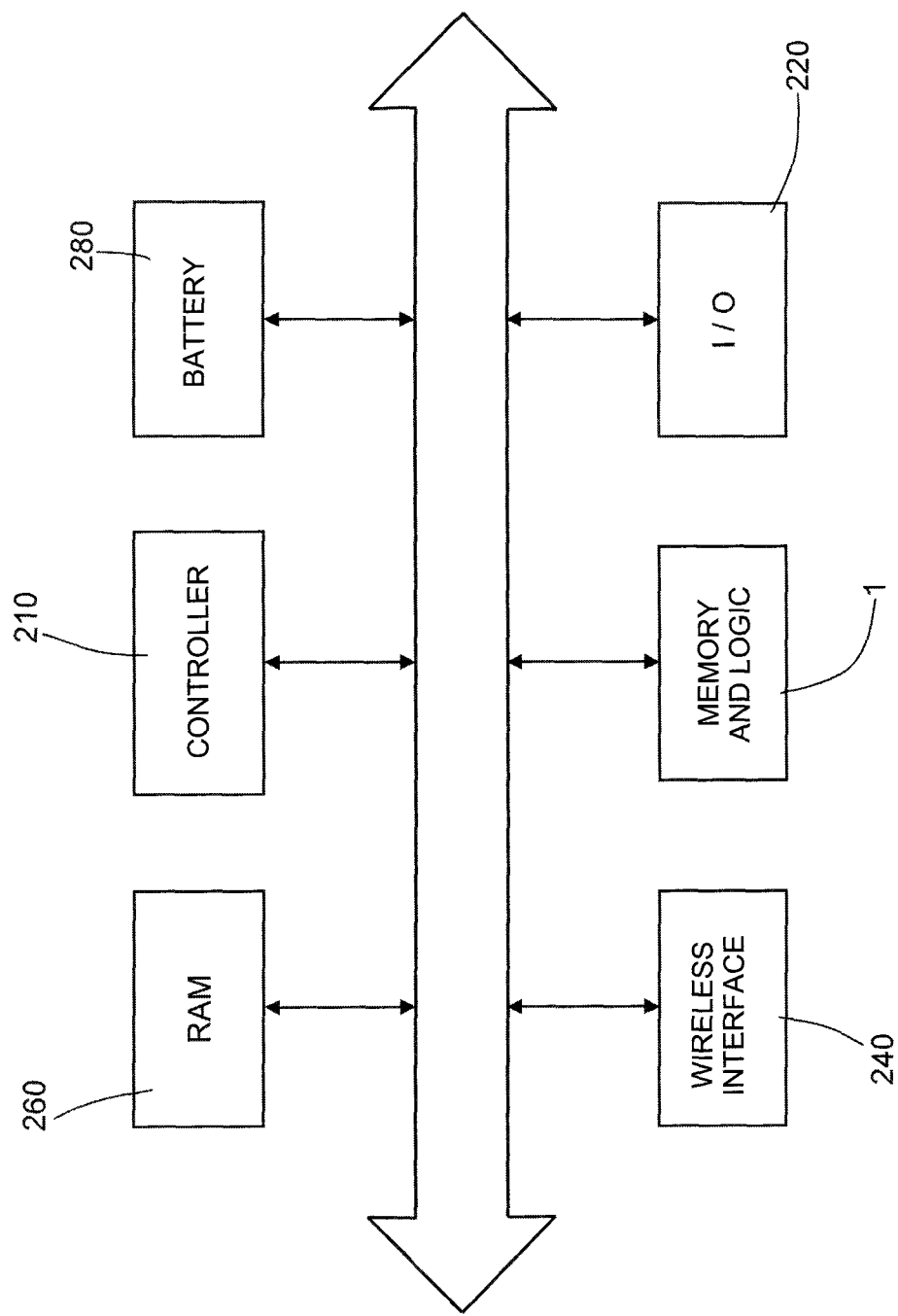
FIG. 22 is a schematic representation of a system that uses the phase-change memory device according to the present disclosure.

FIG. 22 illustrates a portion of a system 200 according to an embodiment of the present disclosure. The system 200 may be implemented in various devices, such as for example PDAs, portable computers, phones, photographic cameras, video cameras, etc.

The system 200 may include a controller 210 (e.g., a microprocessor), an input/output device 220, for example a keypad and a display, a chip housing in an integrated form the phase-change memory device 1' and the control logic 1" (designated as a whole by the reference number 1), a wireless interface 240, and a random-access memory (RAM) 260, connected together by a bus system 250. According to one embodiment, the system 200 may be supplied by a battery 280, or alternatively by a mains supply source. It is clear that the scope of the present disclosure is not limited to embodiments comprising all the components of FIG. 22. For example, one or more from among the random-access memory (RAM) 260, the wireless interface 240, the battery 280, and the input/output device 220 may be omitted.

The advantages of the present disclosure emerge clearly from the foregoing description.

In particular, formation of the heater with dual protection effectively prevents oxidation thereof during the manufacturing steps.

Further, by providing the memory in the same wafer as the one that houses the logic circuitry, it is possible to obtain the conductive vias 62a for the bitline contacts of the memory simultaneously (i.e., with one and the same mask) with formation of the conductive vias 62b for the contacts of the logic circuitry.

Finally, it is clear that modifications and variations may be made to what has been described and illustrated herein, without thereby departing from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A phase-change memory cell, comprising:
a substrate;
a selection transistor in the substrate and including a first conduction electrode;
a first electrical-insulation layer on the selection transistor;
a first conductive through via through the electrical-insulation layer and electrically coupled to the first conduction electrode;
a heater element including a first portion in electrical contact with the first conductive through via and a second portion that extends in electrical continuity with, and orthogonal to, the first portion;
a first protection element extending on the first and second portions of the heater element;
a second protection element extending in direct lateral contact with the first portion of the heater element and with the first protection element; and
a phase-change region extending over, and in electrical and thermal contact with, the heater element.

2. The memory cell according to claim 1, wherein the first portion of the heater element extends, in lateral cross-sectional view, along a first direction parallel to a plane along a surface of the substrate, the heater being positioned on the surface, and the second portion of the heater element extends, in lateral cross-sectional view, along a second direction orthogonal to the plane of the surface of the substrate.

3. The memory cell according to claim 1, wherein the first portion of the heater element has a spatial extension, in the first direction, that is equal to a thickness, in the first direction, of the first protection element.

4. The memory cell according to claim 1, wherein the second protection element has a spatial extension, along the second direction, that is equal to a sum of thicknesses, along the second direction, of the first portion of the heater element and of the first protection element.

5. The memory cell according to claim 1, wherein the heater element is made of a resistive material subject to oxidation, and the first and second protection elements are made of respective materials configured to inhibit said oxidation of the heater element.

6. The memory cell according to claim 1, further comprising:
a second electrical-insulation layer on the phase-change region;
a conductive line on the second electrical-insulation layer; and
a second conductive through via through the second electrical-insulation layer, which forms an electrical connection between the conductive line and the phase-change region.

7. The memory cell according to claim 6, further comprising a barrier region extending over and in contact with said phase-change region, and a sealing layer extending between the barrier region and the second electrical-insulation layer, said second conductive through via penetrating through the sealing layer.

8. The memory cell according to claim 1, wherein the selection transistor further includes a second conduction electrode and a control electrode, said first conduction electrode being a drain electrode, which forms a bitline selector of the memory cell, the second conduction electrode being a source electrode, and the control electrode being a gate electrode, which forms a wordline selector of the memory cell.

9. A chip, comprising:
a plurality of phase-change memory cells integrated in a substrate, each memory cell including:
a selection transistor in the substrate and including a first conduction electrode;
a first electrical-insulation layer on the selection transistor;
a first conductive through via through the electrical-insulation layer and electrically coupled to the first conduction electrode;
a heater element including a first portion in electrical contact with the first conductive through via and a second portion that extends in electrical continuity with, and orthogonal to, the first portion;
a first protection element extending on the first and second portions of the heater element;
a second protection element extending in direct lateral contact with the first portion of the heater element and with the first protection element; and
a phase-change region extending over, and in electrical and thermal contact with, the heater element.

10. The chip according to claim 9, further comprising:
a second electrical-insulation layer on the phase-change region of each memory cell; and
a conductive line on the second electrical-insulation layer; wherein each memory cell includes:
a second conductive through via through the second electrical-insulation layer, which forms an electrical connection between the conductive line and the phase-change region.

11. The chip according to claim 10, further comprising:
one or more control transistors embedded at least in part in the first electrical-insulation layer;
one or more first control through vias, which extend through the electrical-insulation layer and are coupled to respective conduction electrodes of the one or more control transistors; and
one or more second control through vias, which extend through the second electrical-insulation layer, aligned to respective first control through vias to form a conductive path between the one or more control transistors and a front side of the chip.

12. A system, comprising:
a processing unit;
an interface coupled to the processing unit; and
a phase-change memory device coupled to the processing unit and including a plurality of phase-change memory cells integrated in a substrate, each memory cell including: a plurality of phase-change memory cells integrated in a substrate, each memory cell including:
a selection transistor in the substrate and including a first conduction electrode;
a first electrical-insulation layer on the selection transistor;
a first conductive through via through the electrical-insulation layer and electrically coupled to the first conduction electrode;
a heater element including a first portion in electrical contact with the first conductive through via and a second portion that extends in electrical continuity with, and orthogonal to, the first portion;
a first protection element extending on the first and second portions of the heater element;
a second protection element extending in direct lateral contact with the first portion of the heater element and with the first protection element; and
a phase-change region extending over, and in electrical and thermal contact with, the heater element.

13. The system according to claim 12, wherein the memory device includes:
a second electrical-insulation layer on the phase-change region of each memory cell; and
a conductive line on the second electrical-insulation layer; wherein each memory cell includes:
a second conductive through via through the second electrical-insulation layer, which forms an electrical connection between the conductive line and the phase-change region.

14. The system according to claim 13, wherein the memory device includes:
one or more control transistors embedded at least in part in the first electrical-insulation layer;
one or more first control through vias, which extend through the electrical-insulation layer and are coupled to respective conduction electrodes of the one or more control transistors; and
one or more second control through vias, which extend through the second electrical-insulation layer, aligned to respective first control through vias to form a conductive path between the one or more control transistors and a front side of the chip.

15. A method for manufacturing a phase-change memory cell, comprising:
forming a selection transistor in a substrate, the selection transistor including a first conduction electrode;
forming a first electrical-insulation layer on the selection transistor;
forming a conductive through via through the first electrical-insulation layer and electrically coupled to the first conduction electrode;
forming a heater element including a first portion in electrical contact with the first conductive through via and a second portion that extends in electrical continuity with, and orthogonal to, the first portion;
forming a first protection element extending on the first and second portions of the heater element;
forming a second protection element extending in direct lateral contact with the first portion of the heater element and with the first protection element; and
forming a phase-change region extending over, and in electrical and thermal contact with, the heater element.

16. The method according to claim 15, further comprising:
forming a first structural layer on the first electrical-insulation layer; and
removing selective portions of the first structural layer for forming a trench exposed through which is, at least in part, the conductive through via, said trench having an inner side wall, wherein:
forming the heater element includes depositing a resistive layer in the trench;
forming the first protective layer includes depositing the first protective layer on the resistive layer; and removing the first protective layer except for portions thereof that extend facing the inner side wall of the trench and on the first conductive through via, exposing surface regions of the resistive layer;
forming the heater element includes removing the regions of the resistive layer exposed through the first protective layer;
forming the second protective layer includes depositing the second protective layer in the trench; and removing the second protective layer except for portions thereof that extend in direct lateral contact with the first portion of the heater element and with the first protection element.

17. The method according to claim 16, wherein:
removing the first protective layer includes forming first protection walls having a thickness, measured starting from the side wall and in a first direction parallel to a surface of the substrate on which the first protective layer is formed, comprised between 20 and 100 nm, and
removing the second protective layer includes forming second protection walls having a thickness, measured starting from the first protective layer and in the first direction, comprised between 10 and 60 nm.

18. The method according to claim 16, wherein forming the trench includes defining the inner side wall in a proximity of a top face of the conductive through via.

19. The method according to claim 16, wherein forming the trench includes defining the inner side wall on a top face of the conductive through via.

20. The method according to claim 16, wherein:
depositing the resistive layer includes depositing a resistive material subject to oxidation; and
depositing the first and second protective layers include depositing respective materials designed to form a protection from said oxidation of the resistive layer.

* * * * *